United States Patent
Cho et al.

(10) Patent No.: US 8,314,021 B2
(45) Date of Patent: Nov. 20, 2012

(54) METHOD FOR FABRICATING SEMICONDUCTOR DEVICE WITH BURIED GATES

(75) Inventors: Jik-Ho Cho, Gyeonggi-do (KR);
Seung-Jin Yeom, Gyeonggi-do (KR);
Seung-Hee Hong, Gyeonggi-do (KR);
Nam-Yeal Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 34 days.

(21) Appl. No.: 12/938,806

(22) Filed: Nov. 3, 2010

(65) Prior Publication Data
US 2011/0244673 A1    Oct. 6, 2011

(30) Foreign Application Priority Data
Apr. 5, 2010  (KR) .................. 10-2010-0030956

(51) Int. Cl.
*H01L 21/3205*    (2006.01)
*H01L 21/4763*    (2006.01)

(52) U.S. Cl. ... 438/589; 438/648; 438/685; 257/E21.19; 257/E21.584

(58) Field of Classification Search ............ 438/589, 438/648, 685; 257/E21.19, E21.584
See application file for complete search history.

(56) References Cited

U.S. PATENT DOCUMENTS

| 2004/0173844 A1* | 9/2004 | Williams et al. .......... 257/329 |
| 2006/0183301 A1* | 8/2006 | Yeom et al. .............. 438/478 |
| 2008/0124463 A1* | 5/2008 | Bour et al. ............ 427/255.28 |
| 2008/0254602 A1* | 10/2008 | Chiu ..................... 438/513 |

FOREIGN PATENT DOCUMENTS

| JP | 09-283624 | 10/1997 |
| KR | 1020050115822 | 12/2005 |
| KR | 1020070066945 | 6/2007 |
| KR | 1020080089095 | 10/2008 |

OTHER PUBLICATIONS

Notice of Preliminary Rejection issued from Korean Intellectual Property Office on Jun. 28, 2011.

* cited by examiner

*Primary Examiner* — Leonard Chang
(74) *Attorney, Agent, or Firm* — IP & T Group LLP

(57) ABSTRACT

A method for fabricating a semiconductor device includes: forming a thin film over trenches by using a first source gas and a first reaction gas; performing a first post-treatment on the thin film by using a second reaction gas; and performing a second post-treatment on the thin film by using a second source gas.

20 Claims, 6 Drawing Sheets

US 8,314,021 B2

METHOD FOR FABRICATING SEMICONDUCTOR DEVICE WITH BURIED GATES

CROSS-REFERENCE TO RELATED APPLICATIONS

The present application claims priority of Korean Patent Application No. 10-2010-0030956, filed on Apr. 5, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with buried gates (BG).

With buried gates, the integration degree of a cell transistor is increased in a method for fabricating a Dynamic Random Access Memory (DRAM) device using under 60 nm technology while securing proper operation characteristics. The buried gates are formed by forming trenches over a substrate and then filling the inside of each trench with a gate. By using such a method, the parasitic capacitance between bit lines and gates may be significantly decreased.

FIG. 1 is a cross-sectional view illustrating a conventional semiconductor device with buried gates.

Referring to FIG. 1, the conventional semiconductor device with buried gates includes trenches 12 formed over a substrate 11, a gate insulation layer 13 formed on the surface of the trenches 12, a gate electrode 14 formed over the gate insulation layer 13 to fill a portion of each trench 12, and a sealing layer 15 formed over the gate electrode 14 to fill the remaining portion of the trench 12.

Here, since a buried gate forms the gate electrode 14 within each trench 12, resistivity characteristics and burial characteristics of the buried gate become significant. Therefore, the conventional technology may use a bi-layer structure where a titanium nitride layer (TiN) and a tungsten (W) layer are stacked to form the gate electrode 14.

As to the tungsten (CVD-W) layer, a barrier metal and a nucleation layer having relatively high resistivity compared with that of a bulk tungsten layer are used to prevent damages caused by fluorine. In having the relatively high resistivity, since the area of the bulk tungsten layer is decreased, proper resistance characteristics in accordance with a decreased linewidth of the bulk tungsten layer may be difficult to obtain. Further, since a barrier metal is used, there is a concern that the area of the tungsten layer is decreased.

To address such concerns, low-resistance titanium nitride (TiN) single layer formed by using a titanium tetrachloride (TiCl$_4$) may be used as the gate electrode 14 of the buried gates. Since the titanium nitride (TiN) single layer formed by using a titanium tetrachloride (TiCl$_4$) (that is, TiCl$_4$—TiN) has excellent step coverage, it is often used as a line material of the gate electrode 14 filling the inside of the trenches 12.

A titanium nitride (TiN) layer deposited using a titanium tetrachloride (TiCl$_4$) source includes chlorine (Cl) in the layer. Here, since chlorine is a material having a high electronegativity and electron affinity in the Periodic Table, chlorine functions as an electron trapping sites even if the amount of chlorine within the titanium nitride (TiN) layer is minimal. Therefore, the concentration of chlorine is desired to be reduced to obtain a low resistance characteristic. Methods for decreasing the concentration of chlorine includes a method of depositing a thin film, such as several mono layers, through an Atomic Vapor Deposition (ALD) method or an ALD-like deposition method and performing a post-treatment to increase the efficiency of removing chlorine from a thin film, and a method of increasing a deposition temperature while using the same deposition method and thus increasing the speed of chlorine removal from the thin film. The foregoing methods, however, raises a concern that the step coverage is deteriorated when the deposition temperature is increased. Here, since the gate electrode 14 is disposed within trenches 12, the deterioration of the step coverage raises a concern that desired characteristics of the gate electrode 14 may deteriorate.

SUMMARY OF THE INVENTION

An embodiment of the present invention is directed to a method for fabricating a semiconductor device with low-resistance buried gates.

Another embodiment of the present invention is directed to a method for fabricating a semiconductor device with buried gates which have excellent step coverage and small amount of impurity within a thin film.

In accordance with an embodiment of the present invention, a method for fabricating a semiconductor device includes: forming a thin film over trenches by using a first source gas and a first reaction gas; performing a first post-treatment on the thin film by using a second reaction gas; and performing a second post-treatment on the thin film by using a second source gas.

In accordance with another embodiment of the present invention, a method for fabricating a semiconductor device includes: forming trenches by etching a substrate; forming a titanium nitride (TiN) layer over the substrate with the trenches by using a first source gas and a first reaction gas; performing a first post-treatment on the titanium nitride (TiN) layer by using a second reaction gas; and performing a second post-treatment on the titanium nitride (TiN) layer obtained after the first post-treatment by using a second source gas.

In accordance with yet another embodiment of the present invention, a method for fabricating a semiconductor device, includes: forming trenches by etching a substrate; forming a titanium nitride (TiN) layer over the substrate with the trenches by using a first titanium tetrachloride (TiCl$_4$) source and a reaction gas; performing a post-treatment on the titanium nitride (TiN) layer by using ammonia (NH$_3$); and performing a plasma treatment on the titanium nitride (TiN) layer obtained after the post-treatment by using a second titanium tetrachloride (TiCl$_4$) source.

DESCRIPTION OF SPECIFIC EMBODIMENTS

Figure 1:
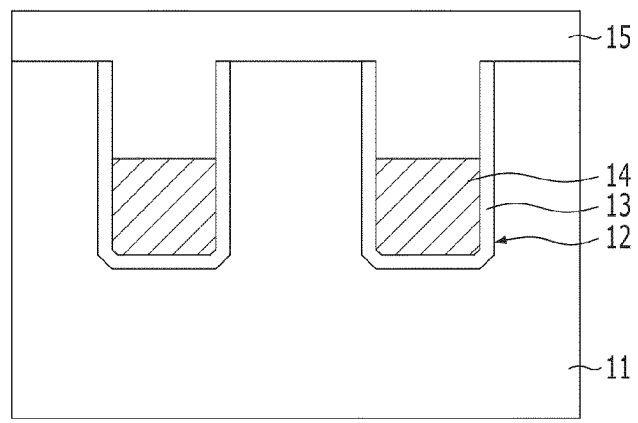
FIG. 1 is a cross-sectional view illustrating a conventional semiconductor device with buried gates.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In forming a titanium nitride (TiN) layer by using a titanium tetrachloride ($TiCl_4$), when a deposition temperature is increased to obtain a low-resistance characteristic, the concentration of chlorine (Cl) within a thin film is decreased but the step coverage may deteriorate. The deterioration in the step coverage may form a seam within buried gates and deteriorates gate resistance characteristics. While the formation of seam may be suppressed within the buried gates by adjusting the fabrication process conditions such as the increase in the deposition temperature and gas flow, a low-resistance is desired to be improved further to counter effects of the increase in the integration degree of a semiconductor device.

According to an embodiment of the present invention, which is described hereafter, a proper step coverage within trenches is obtained by applying a low-temperature fabrication process and a low-resistance characteristic is secured by increasing the thin film density of a titanium nitride layer.

In case of a titanium nitride layer deposited within buried gates, grains are fine due to the titanium nitride layer having a thickness equal to approximately 50% of that of the buried gates. Due to the fineness of the grains, the area of the thin film occupied by the grain boundary is great. When titanium (Ti) is implanted into the grain boundary, the thin film density is increased and when the fabrication process is performed at a low temperature under the circumstances, the low resistivity characteristic may be improved even without a decrease in the concentration of chlorine (Cl) within the thin film. When the fabrication is performed at a high temperature under the same circumstances, the low resistivity characteristic may be still maintained.

FIGS. 2A to 2G are cross-sectional views illustrating a method for fabricating a semiconductor device with buried gates in accordance with an embodiment of the present invention. FIG. 3 illustrates a unit cycle for forming a gate conductive layer in the semiconductor device with buried gates in accordance with the embodiment of the present invention.

Figure 2A:
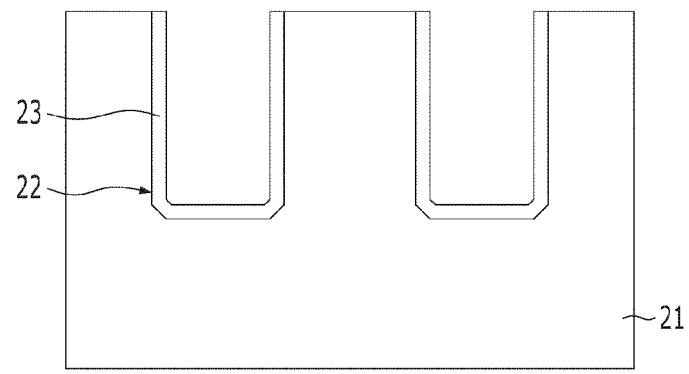
FIGS. 2A to 2G are cross-sectional views illustrating a method for fabricating a semiconductor device with buried gates in accordance with an embodiment of the present invention.
Figure 3:
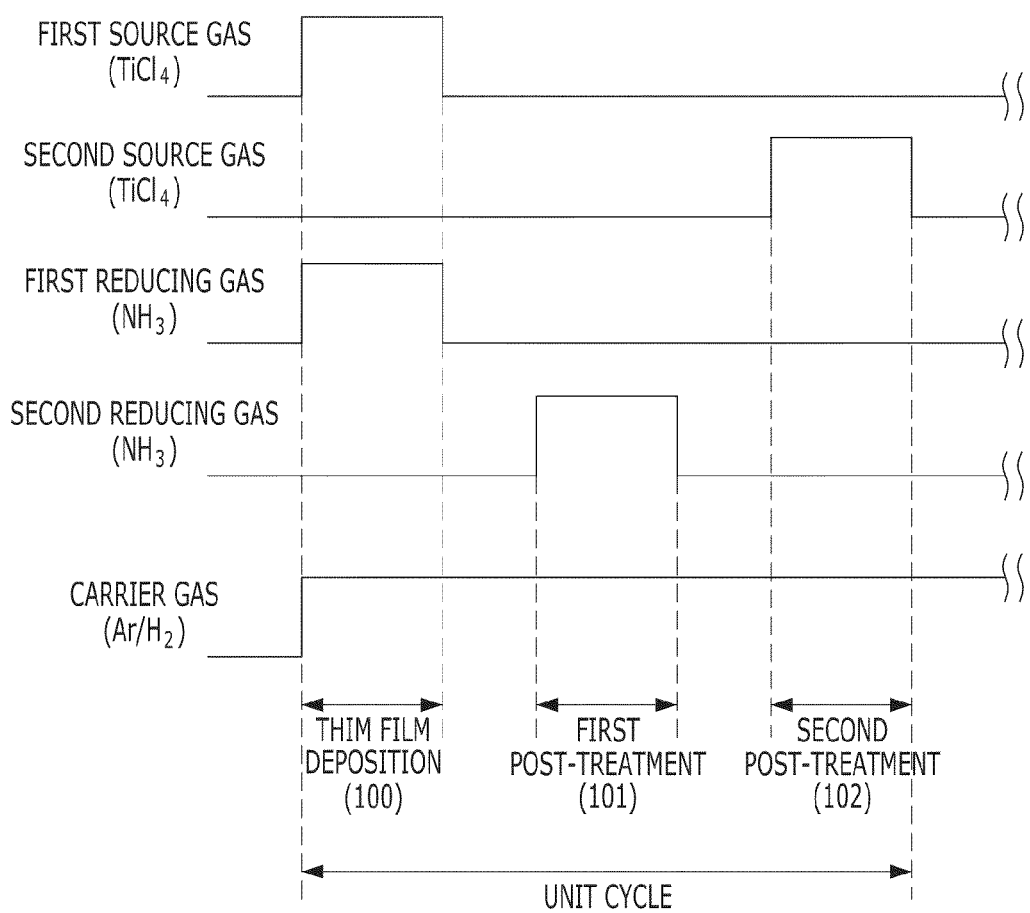
FIG. 3 illustrates a unit cycle for forming a gate conductive layer in the semiconductor device with buried gates in accordance with the embodiment of the present invention.

Referring to FIG. 2A, trenches 22 are formed over a substrate 21. The substrate 21 may be a silicon substrate.

The trenches 22 may be formed by forming a hard mask pattern (not shown) over the substrate 21 and etching the substrate 21 with the hard mask pattern (not shown) used as an etch barrier. The trenches 22 are later filled with a gate electrode, where the trenches 22 may be formed as a line.

The hard mask pattern (not shown) used for forming the trenches 22 may be an oxide layer, a nitride layer, or a polysilicon layer. A mask may be formed using a photoresist layer in order to form the hard mask pattern (not shown).

Subsequently, a gate insulation layer 23 is formed on the surface of the trenches 22. The gate insulation layer 23 may include an oxide layer such as a silicon oxide ($SiO_2$) layer.

The silicon oxide layer used as the gate insulation layer 23 may be formed through a thermal oxidation process.

Referring to FIGS. 2B to 2F and FIG. 3, a gate conductive layer 25 filling the trenches 22 over the gate insulation layer 23 is formed. The gate conductive layer 25 may be formed through an Atomic Layer Deposition (ALD) process. Hereafter, a method for forming the gate conductive layer 25 is described in detail in accordance with one embodiment of the present invention.

Figure 2B:
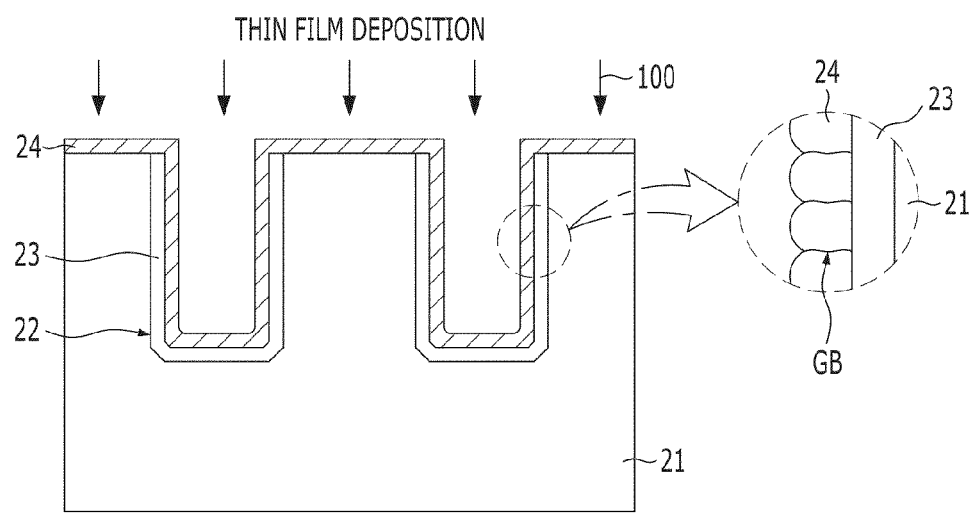

Referring to FIGS. 2B and 3, a thin film deposition process 100 for depositing a thin film 24 is performed on the substrate 21 including the trenches 22 by using a first gas and a first reaction gas. The first source gas includes an element that constitutes the thin film 24 (e.g., titanium tetrachloride ($TiCl_4$)). The first reaction gas reacts with the first source gas and forms the thin film 24 (e.g., ammonia ($NH_3$)). Therefore, the thin film 24 formed as the titanium tetrachloride ($TiCl_4$) reacts with the ammonia ($NH_3$) may be a titanium nitride (TiN) layer. Here, a label 'GB' denotes grain boundary within the thin film 24.

Here, during the deposition of the thin film 24, a carrier gas (also referred to as a purge gas) may be used to remove the first source gas and the first reaction gas. Here, as the carrier gas, argon (Ar) gas or hydrogen ($H_2$) gas may be used alone, or a mixed gas ($Ar/H_2$) of argon (Ar) gas and hydrogen ($H_2$) gas may be used.

Figure 2C:
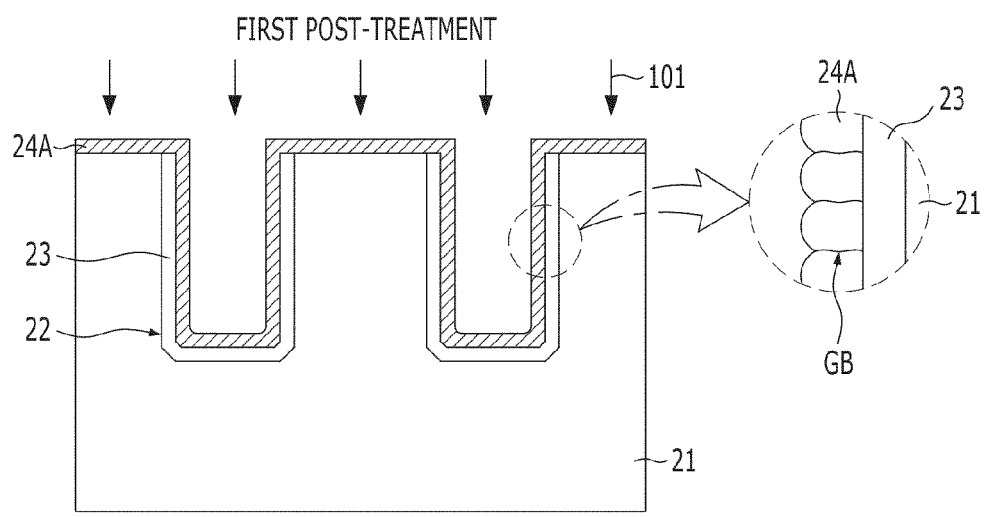

Referring to FIGS. 2C and 3, a first post-treatment 101 is performed on the deposited thin film 24 by using a second reaction gas. Hereafter, the thin film 24 obtained after the first post-treatment 101 is referred to as a first post-treated thin film 24A.

By performing the first post-treatment 101, the low resistance characteristic of the first post-treated thin film 24A may be obtained by removing impurities the thin film 24A. The first post-treatment 101 may be performed through a thermal treatment or a plasma treatment. Here, the same gas as the first reaction gas may be used as the second reaction gas (e.g., ammonia ($NH_3$)). More specifically, the first post-treated thin film 24A (a titanium nitride layer) formed using titanium tetrachloride ($TiCl_4$) and ammonia ($NH_3$) includes chlorine (Cl) within the film. The chlorine (Cl) within the titanium nitride layer may be removed by performing the first post-treatment 101 using the second reaction gas, which is ammonia ($NH_3$). Here, the chlorine (Cl) within the titanium nitride layer may be removed through a series of processes of generating hydrogen chloride (HCl) by a chemical reaction of the chlorine (CL) with hydrogen of the ammonia ($NH_3$) and removal of the byproduct (hydrogen chloride (HCl)).

Here, a carrier gas may be used during the first post-treatment 101 in order to facilitate the introduction and removal (for example, through exhaustion) of the second reaction gas and the chemical-reaction byproduct (the hydrogen chloride (HCl)). The carrier gas may be argon (Ar) gas or hydrogen ($H_2$) gas alone or a mixed gas ($Ar/H_2$) of argon (Ar) gas and hydrogen ($H_2$) gas.

Figure 2D:
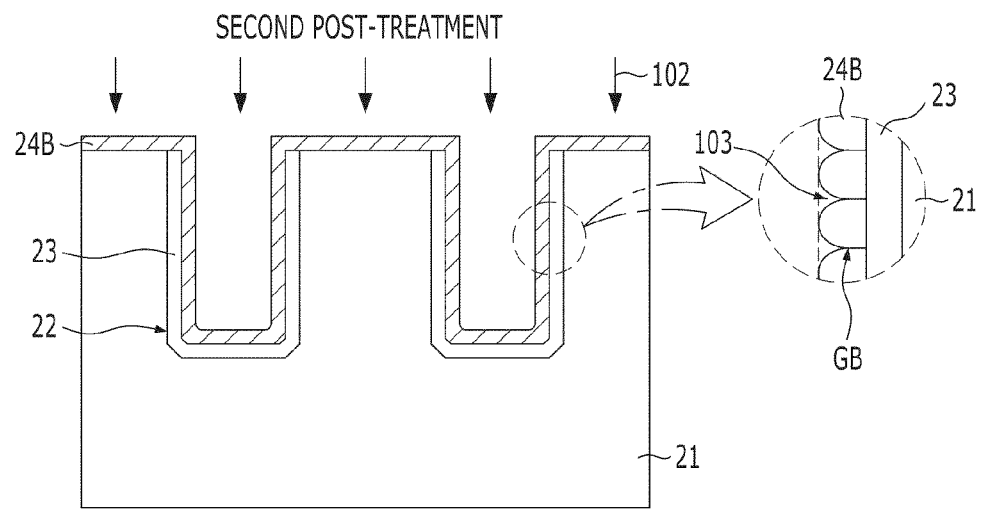
Figure 2E:
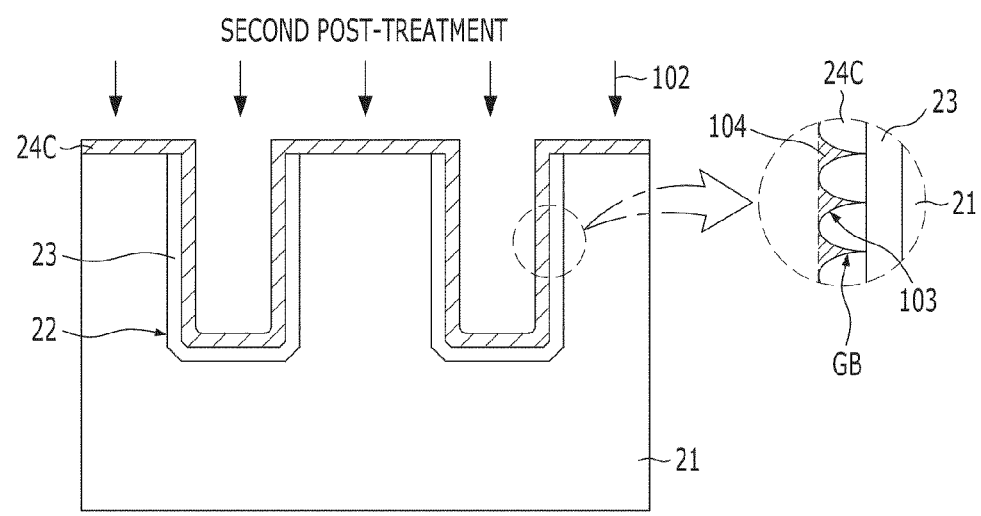

Referring to FIGS. 2D, 2E and 3, a second post-treatment 102 is performed on the first post-treated thin film 24A by using a second source gas. Here, the second post-treatment 102 smoothes the rough surface of the first post-treated thin film 24A while obtaining the low resistivity characteristic of the first post-treated thin film 24A by increasing the thin film density of the first post-treated thin film 24A at the same time. The second post-treatment 102 may be performed using a plasma treatment.

As for the second source gas, a gas including an element making up the first post-treated thin film 24A (e.g., a gas containing titanium (Ti)) may be used. According to an example, the same gas as the first source gas may be used as the second source gas (e.g., titanium tetrachloride ($TiCl_4$)). Here, hydrogen ($H_2$) gas may be used alone as a carrier gas during the second post-treatment 102 in order to facilitate the introduction and exhaustion of the second source gas, or a mixed gas ($Ar/H_2$) of argon (Ar) gas and hydrogen ($H_2$) gas may be used as the carrier gas.

Here, the second post-treatment 102 includes selectively etching the first post-treated thin film 24A with source ions, which are produced as the second source gas is ionized by plasma, (refer to FIG. 2D), and implanting the element included in the second source gas, which constitutes the first post-treated thin film 24A, into the etched, first post-treated thin film 24A at the grain boundary (GB) of the etched, first post-treated thin film 24A (refer to FIG. 2E). Hereafter, the change of the first post-treated thin film 24A during the second post-treatment 102 is described in detail.

First, referring to FIGS. 2D and 3, the second source gas, which is titanium tetrachloride ($TiCl_4$), is ionized by plasma to produce titanium tetrachloride ($TiCl_x$) ions during the second post-treatment 102, and the titanium tetrachloride ($TiCl_x$) ions selectively etch the first post-treated thin film 24A, which is a titanium nitride layer. Hereafter, the etched first post-treated thin film 24A is referred to as a second post-treated thin film 24B.

Here, the etching of the titanium nitride layer by the titanium tetrachloride ($TiCl_x$) ions is performed faster in the grain boundary (GB) than in the grain. Therefore, a groove 103 is formed along the grain boundary (GB) in the second post-treated thin film 24B during the second post-treatment 102.

Subsequently, referring to FIGS. 2E and 3, the element included in the second source gas (which is an element that constitutes the second post-treated thin film 24B such as titanium) is implanted into the inside of the grains of the second post-treated thin film 24B along the groove 103, as if the titanium fills the groove 103 formed along the grain boundary (GB) of the second post-treated thin film 24B (refer to a reference numeral '104'). Hereafter, the second post-treated thin film 24B into which the element included in the second source gas is implanted is referred to as a source gas element-implanted thin film 24C.

Here, the titanium implanted into the source gas element-implanted thin film 24C may be generated through a reaction ($TiCl_x+H2 \rightarrow Ti+HCl\uparrow$) between hydrogen used as a carrier gas and titanium tetrachloride ($TiCl_4$) ions which are produced by titanium tetrachloride ($TiCl_4$) being ionized by plasma. As described above, as the element included in the second source gas is implanted into the source gas element-implanted thin film 24C, the thin film density of the source gas element-implanted thin film 24C is increased due to the implanted element. Also, the selective etching of the source gas element-implanted thin film 24C and the implantation of the element included in the second source gas during the second post-treatment 102 may smooth the rough surface of source gas element-implanted thin film 24C.

Figure 2F:
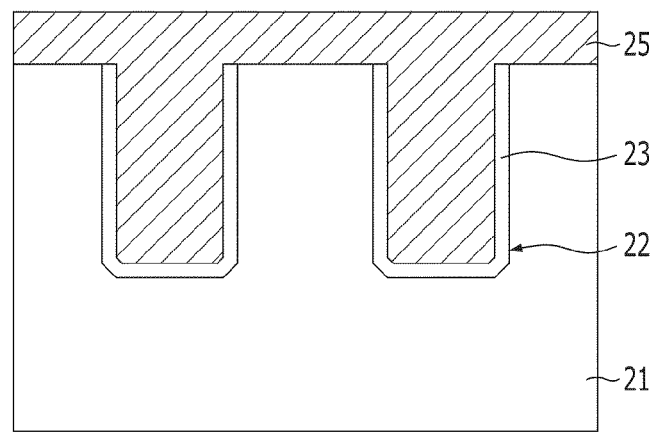

Referring to FIG. 2F, the thin film deposition process 100, the first post-treatment 101, and the second post-treatment 102 are performed in one unit cycle, and a gate conductive layer 25 filling the trenches 22 is formed by repeatedly performing the unit cycle. Here, the gate conductive layer 25 may be the source gas element-implanted thin film 24C formed through the thin film deposition process 100, the first post-treatment 101, and the second post-treatment 102, that is, it may be a titanium nitride layer of a bulk (a thick film) form formed as a plurality of titanium nitride layers of thin film stacked together.

Here, the process of forming the gate conductive layer 25 by repeatedly performing the unit cycle may be performed at a temperature ranging from approximately 450° C. to approximately 550° C.

Figure 2G:
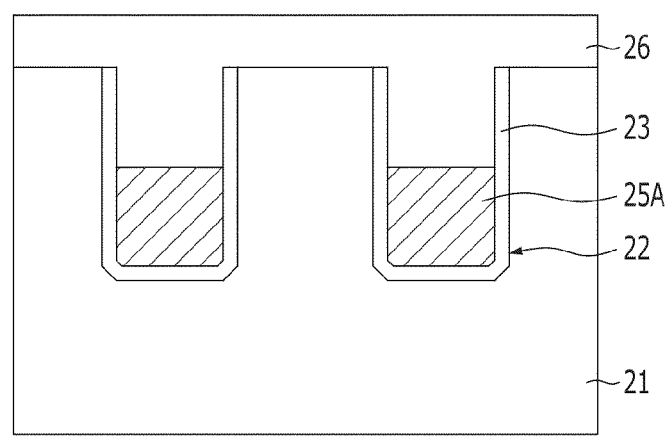

Referring to FIG. 2G, a gate electrode 25A filling a portion of each trench 22, that is, buried gates, is formed by etching the gate conductive layer 25 through a blanket etch process, e.g., an etch-back process.

Subsequently, a sealing layer 26 filling the remaining portion of each trench is formed over the gate electrode 25A. The sealing layer 26 may be an oxide layer, a nitride layer, or a stacked layer of a nitride layer and an oxide layer. For example, the sealing layer 26 may be formed by thinly forming a sealing nitride layer (not shown) and then gap-filling with a sealing oxide layer (not shown) such as a spin-on dielectric (SOD) layer.

According to the method for fabricating a semiconductor device with buried gates in accordance with the embodiment of the present invention, which is described above, the low-resistance characteristic of the buried gates may be obtained by removing impurities out of a titanium nitride layer through the first post-treatment 101. Moreover, the low-resistance characteristic of the buried gates may be improved more by increasing the thin film density of the titanium nitride layer through the second post-treatment 102.

Also, the fabrication process may be performed at a lower temperature by improving the low-resistance characteristic of the buried gates through the first post-treatment 101 and the second post-treatment 102, and by using the low-temperature process, a proper step coverage of the titanium nitride layer may be obtained. Thus, the low-resistance characteristic of the buried gates may be obtained by preventing seam from being formed due to deterioration of the step coverage.

Furthermore, the low-resistance characteristic of the buried gates may be obtained through the second post-treatment 102 by smoothing the rough surface of the titanium nitride layer.

Hereafter, an embodiment of the present invention is described in detail by referring to an image showing a titanium nitride layer formed according to a conventional process (refer to FIG. 4A), an image showing a titanium nitride layer formed in accordance with an embodiment of the present invention (refer to FIG. 4B), and Table 1 which specifies the characteristics of the two images.

Figure 4A:
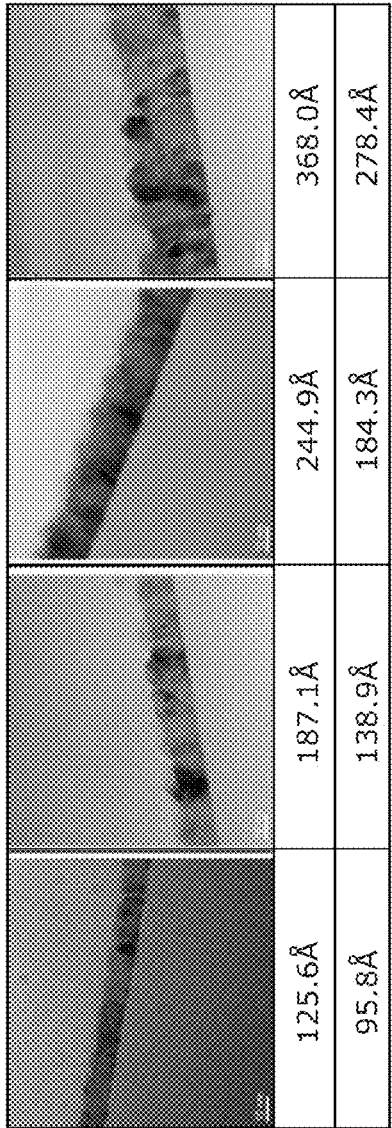
FIG. 4A is an image showing a titanium nitride layer formed according to a conventional process.
Figure 4B:
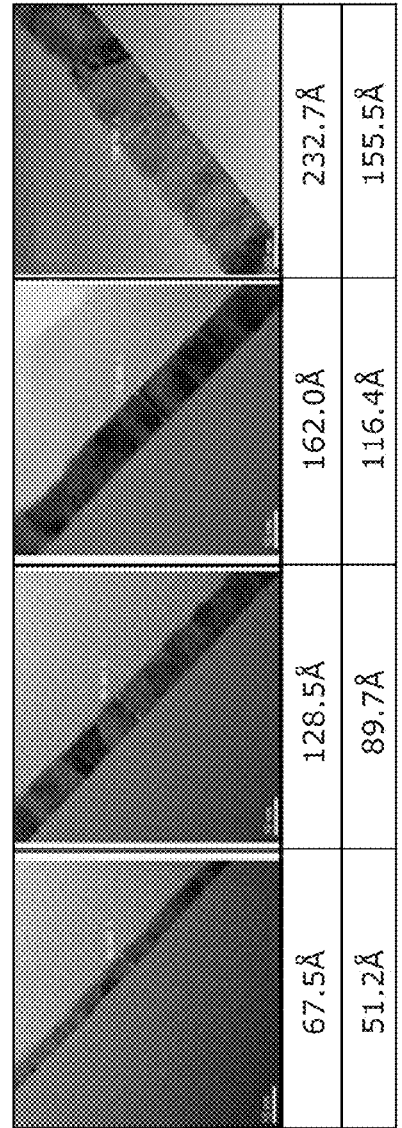
FIG. 4B is an image showing a titanium nitride layer formed in accordance with an embodiment of the present invention.

FIG. 4A is an image showing a titanium nitride layer formed according to a conventional process. The titanium nitride layer was formed through an Atomic Layer Deposition (ALD) method, which performs the processes of source gas implantation, purging, reaction gas implantation, and purging as a unit cycle and repeatedly running the unit cycle. FIG. 4B is an image showing a titanium nitride layer formed in accordance with an embodiment of the present invention. The titanium nitride layer was formed by taking the thin film deposition, the first post-treatment 101, and the second post-treatment 102 as a unit cycle and repeatedly performing the unit cycle. Table 1 shows the characteristics of the titanium nitride layer formed according to the conventional technology and the titanium nitride layer formed according to an embodiment of the present invention.

First, in FIGS. 4A and 4B, 'in line THK (XRF)' denotes the thickness measured with X-ray fluorescence spectrometry equipment, and 'CNT THK (TEM)' denotes the thickness measured at the center CNT of a wafer with transmission electron microscope equipment.

TABLE 1

|  | Prior Art | Present Invention |
|---|---|---|
| Temperature (° C.) | 600 | 500 |
| Thickness (Å) | 120 | 120 |
| Resistivity (uΩ/cm) | 112 | 80 |
| Roughness (nm) | 1.347 | 0.4683 |
| Thin film density (g/cm$^3$) | 5.25 | 5.8 |
| Ti/N ratio | 1.01 | 1 |

Referring to FIGS. 4A and 4B and Table 1, the technology of the present invention forms a titanium nitride layer through a semiconductor device fabrication process performed at a relatively lower temperature than the conventional technology. When the titanium nitride layer is deposited at a relatively low temperature, proper step coverage characteristics of the titanium nitride layer may be obtained. Therefore, a defect, such as seam within a thin film, may be prevented from being formed when the titanium nitride layer fills a structure such as trenches.

Subsequently, when the titanium nitride layer is formed with the same thickness, the resistivity of the conventional technology was 112 uΩ/cm, while the resistivity of the present invention was 80 uΩ/cm, which is lower than 112 uΩ/cm. Here, the surface roughness of the titanium nitride layer formed according to the conventional technology was 1.347 nm, while the surface roughness of the titanium nitride layer formed according to the embodiment of the present invention was 0.4683 nm. Also, it may be seen from FIGS. 4A and 4B that the titanium nitride layer formed according to the embodiment of the present invention has more planar surface than the titanium nitride layer formed according to the conventional technology. Therefore, when the titanium nitride layer fills a structure like trenches, a defect, such as seam within a thin film, may be prevented from being formed according to the embodiment of the present invention.

Also, whereas the titanium nitride layer formed according to the prior art has a thin film density of 5.25 g/cm$^3$, the titanium nitride layer formed according to the embodiment of the present invention has a thin film density of 5.8 g/cm$^3$. Here, as the thin film density of the titanium nitride layer increases, the low resistance characteristic of the titanium nitride layer may be improved.

According to the embodiment of the present invention described above, low resistance characteristics of buried gates may be improved by removing impurities out of a titanium nitride layer through a first post-treatment.

Also, the low-resistance characteristic of the buried gates may be obtained by increasing the thin film density of the titanium nitride layer through a second post-treatment.

Moreover, a semiconductor device fabrication process may be performed at a relatively low temperature by improving the low-resistance characteristic of the buried gates through the first and second post-process. Through the low-temperature process, a proper step coverage of the titanium nitride layer may be obtained and a seam often caused by poor step coverage is prevented from occurring, and thus the low-resistance characteristic of the buried gates may be obtained. Since the rough surface of the titanium nitride layer is smoothed through the second post-treatment, the low-resistance characteristics of the buried gates may be obtained.

While the present invention has been described with respect to the specific embodiments, it will be apparent to those skilled in the art that various changes and modifications may be made without departing from the spirit and scope of the invention as defined in the following claims.

For example, the technology of an embodiment of the present invention may be applied to a process of forming a contact. In this case, the trenches serve as structures that provide the space where a contact or a contact plug is to be formed, and the gate conductive layer filling the trenches serves as a contact.

What is claimed is:

1. A method for fabricating a semiconductor device, comprising:
   forming a thin film over trenches by using a first source gas and a first reaction gas;
   performing a first post-treatment on the thin film by using a second reaction gas to remove impurities in the thin film; and
   performing a second post-treatment on the thin film by using a second source gas to increase a density of the first post-treated thin film, wherein the second source gas comprises a gas including an element that makes up the first post-treated thin film,
   wherein the performing of the second post-treatment comprises:
     selectively etching the first post-treated thin film with the second source gas; and
     implanting the element included in the second source gas into the etched first post-treated thin film.

2. The method of claim 1, wherein the first source gas and the second source gas are the same.

3. The method of claim 1, wherein the first reaction gas and the second reaction gas are the same.

4. The method of claim 1, wherein the first post-treatment is performed through a thermal treatment or a plasma treatment.

5. The method of claim 1, wherein the second post-treatment is performed through a plasma treatment.

6. The method of claim 1, wherein the forming of the thin film, the performing of the first post-treatment, and the performing of the second post-treatment are performed in one unit cycle.

7. The method of claim 6, further comprising:
   forming a conductive layer filling the trenches by repeatedly performing the unit cycle.

8. The method of claim 7, wherein the conductive layer comprises a contact or a buried gate.

9. The method of claim 1, wherein the performance of the second post-treatment includes smoothing the rough surface of the thin film.

10. The method of claim 1, wherein the etching of the thin film is performed by ionizing the second source gas and the implanting of the element of the second source gas is performed by reacting ions produced by the ionization of the second source gas with a carrier gas.

11. A method for fabricating a semiconductor device, comprising:
    forming trenches by etching a substrate;
    forming a titanium nitride (TiN) layer over the substrate with the trenches by using a first source gas and a first reaction gas;
    performing a first post-treatment on the titanium nitride (TiN) layer by using a second reaction gas to remove impurities in the titanium nitride (TiN) layer; and
    performing a second post-treatment on the titanium nitride (TiN) layer obtained after the first post-treatment by using a second source gas to increase a density of the titanium nitride (TiN) layer obtained after the first post-treatment, wherein the second source gas comprises a gas including an element that makes up the titanium nitride (TiN) layer, wherein the performing of the second post-treatment comprises:
  selectively etching the titanium nitride (TiN) layer obtained after the first post-treatment with the second source gas; and
  implanting the element included in the second source gas into the etched titanium nitride (TiN) layer.

12. The method of claim 11, wherein the second source gas is a gas containing titanium (Ti).

13. The method of claim 11, wherein the first source gas and the second source gas comprise titanium tetrachloride (TiCl$_4$).

14. The method of claim 11, wherein the first reaction gas and the second reaction gas comprise ammonia (NH$_3$).

15. The method of claim 11, wherein in the performing of the second post-treatment, hydrogen (H$_2$) gas is used along with the second source gas.

16. A method for fabricating a semiconductor device, comprising:
  forming trenches by etching a substrate;
  forming a titanium nitride (TiN) layer over the substrate with the trenches by using a first titanium tetrachloride (TiCl$_4$) source and a reaction gas;
  performing a post-treatment on the titanium nitride (TiN) layer by using ammonia (NH$_3$) to remove impurities in the titanium nitride (TiN) layer; and
  performing a plasma treatment on the titanium nitride (TiN) layer obtained after the post-treatment by using a second titanium tetrachloride (TiCl$_4$) source to increase a density of the titanium nitride (TiN) layer obtained after the post-treatment,
  wherein the performing of the plasma treatment comprises:
    selectively etching the titanium nitride (TiN) layer obtained after the post-treatment with the second titanium tetrachloride (TiCl$_4$) source; and
    implanting titanium included in the second titanium tetrachloride (TiCl4) source into the etched titanium nitride (TiN) layer.

17. The method of claim 16, further comprising:
  repeatedly forming a gate conductive layer filling the trenches by performing the forming of the titanium nitride (TiN) layer, the performing of the post-treatment, and the performing of the plasma treatment that constitute a unit cycle; and
  forming a gate electrode filling a portion of each trench by etching the gate conductive layer through a blanket etch process.

18. The method of claim 16, wherein the reaction gas comprises ammonia (NH$_3$).

19. The method of claim 16, wherein the post-treatment is performed through a thermal treatment or a plasma treatment.

20. The method of claim 16, wherein in the performing of the plasma treatment, hydrogen (H$_2$) gas is used along with the second titanium tetrachloride (TiCl$_4$) source.

* * * * *